US010621267B2

United States Patent
Strachan et al.

(10) Patent No.: US 10,621,267 B2
(45) Date of Patent: Apr. 14, 2020

(54) MEMRISTOR CROSSBAR ARRAY FOR PERFORMING A FOURIER TRANSFORMATION

(71) Applicant: Hewlett Packard Enterprise Development LP, Houston, TX (US)

(72) Inventors: John Paul Strachan, San Carlos, CA (US); Miao Hu, Palo Alto, CA (US); R. Stanley Williams, Portola Valley, CA (US); Zhiyong Li, Foster City, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 113 days.

(21) Appl. No.: 16/064,655

(22) PCT Filed: Jan. 28, 2016

(86) PCT No.: PCT/US2016/015429
§ 371 (c)(1),
(2) Date: Jun. 21, 2018

(87) PCT Pub. No.: WO2017/131711
PCT Pub. Date: Aug. 3, 2017

(65) Prior Publication Data
US 2018/0373675 A1    Dec. 27, 2018

(51) Int. Cl.
*G06F 17/14* (2006.01)
*G06J 1/00* (2006.01)
*H01L 27/24* (2006.01)

(52) U.S. Cl.
CPC ............ *G06F 17/141* (2013.01); *G06J 1/005* (2013.01); *H01L 27/2463* (2013.01)

(58) Field of Classification Search
CPC ..... G06F 17/141; G06J 1/005; H01L 27/2463
USPC ......................................................... 708/405
See application file for complete search history.

(56) References Cited

U.S. PATENT DOCUMENTS

| | | | |
|---|---|---|---|
| 6,914,979 B2 | 7/2005 | Kurtz et al. | |
| 8,112,467 B2 | 2/2012 | Buchert et al. | |
| 8,614,432 B2 | 12/2013 | Pickett et al. | |
| 8,711,646 B2 | 4/2014 | Ong | |
| 10,216,703 B2* | 2/2019 | Gupta | G06F 17/141 |
| 2010/0088356 A1 | 4/2010 | Lloyd et al. | |
| 2015/0155334 A1* | 6/2015 | Lu | H01L 27/2436 257/4 |

(Continued)

OTHER PUBLICATIONS

Alex Pappachen James et al., "Threshold Logic Computing: Memristive-CMOS Circuits for Fast Fourier Transform and Vedic Multiplication," In: IEEE Transactions on Very Large Scale Integration (VLSI) Systems, vol. 23, No. 11, pp. 2690-2694, Nov. 2015, See pp. 2690 and 2692-2693.

(Continued)

*Primary Examiner* — Tan V Mai
(74) *Attorney, Agent, or Firm* — Hewlett Packard Enterprise Patent Department (57) ABSTRACT

A technique includes providing a first set of values to a memristor crossbar array and using the memristor crossbar array to perform a Fourier transformation. Using the memristor crossbar array to perform the Fourier transform includes using the array to apply a Discrete Fourier Transform (DFT) to the first set of values to provide a second set of values.

15 Claims, 6 Drawing Sheets

(56) References Cited

U.S. PATENT DOCUMENTS

2017/0084330 A1* 3/2017 Ichihara ............... G11C 13/004

OTHER PUBLICATIONS

Gao L. et al., "Analog-Input Analog-Weight Dot-Product Operation With Ag/a-Si/Pt Memristive Devices", <https://www.ece.ucsb.edu/~strukov/papers/2012/VLSISOCdp2012.pdf> (Research Paper), Retrieved on Dec. 7, 2015, 6 pages.

International Searching Authority, The International Search Report and the Written Opinion, PCT/US2016/015429, dated Sep. 23, 2016, 14 Pgs.

John Paul Strachan, "The Dot-Product Engine (DPE): exploring high efficiency analog multiplication with memristor arrays," Fourth Rebooting Computing Summit (RCS 4), Dec. 9-11, 2015, 29 Pgs., <http://rebootingcomputing.ieee.org/images/files/pdf/RCS4StrachanFri1030.pdf, See pp. 2-4 and 6-7.

Viera Biolkova et al., "Fourier Analysis of Memristor Excited by Sinusoidal Signal," In: Proceedings fo the 2nd international conference on Mathematical Models and Methods in Modern Science, pp. 154-159, Dec. 10, 2011, See pp. 157-159.

Yogesh N. Joglekar et al., "Fourier Response of a Memristor: Generation of High Harmonics With Increasing Weights," In: IEEE Transactions on Circuits and Systems II: Express Briefs, vol. 59, No. 11, Nov. 2012, 5 Pgs., See pp. 830-831.

Mark McKeown, Texas Instruments, "FFT Implementation on the TMS320VC5505, TMS320C5505, and TMS320C5515 DSPs", Jun. 2010-Jan. 2013, 28 pages.

* cited by examiner

MEMRISTOR CROSSBAR ARRAY FOR PERFORMING A FOURIER TRANSFORMATION

BACKGROUND

The Fourier transformation has many applications, ranging from communication signal processing, differential equation analysis, image processing, audio processing, spectroscopy processing and so forth. For purposes of performing the Fourier transform in a digital processing system, the Fourier transform may be performed using a discrete transform, such as a Discrete Fourier Transform (DFT). The DFT is a matrix operation in which a real or complex value input vector (a vector representing sampled values for a temporally or spatially varying input signal, for example) is transformed into a complex value output vector (a vector representing frequency and phase components of the input signal, for example).

DETAILED DESCRIPTION

Figure 1:
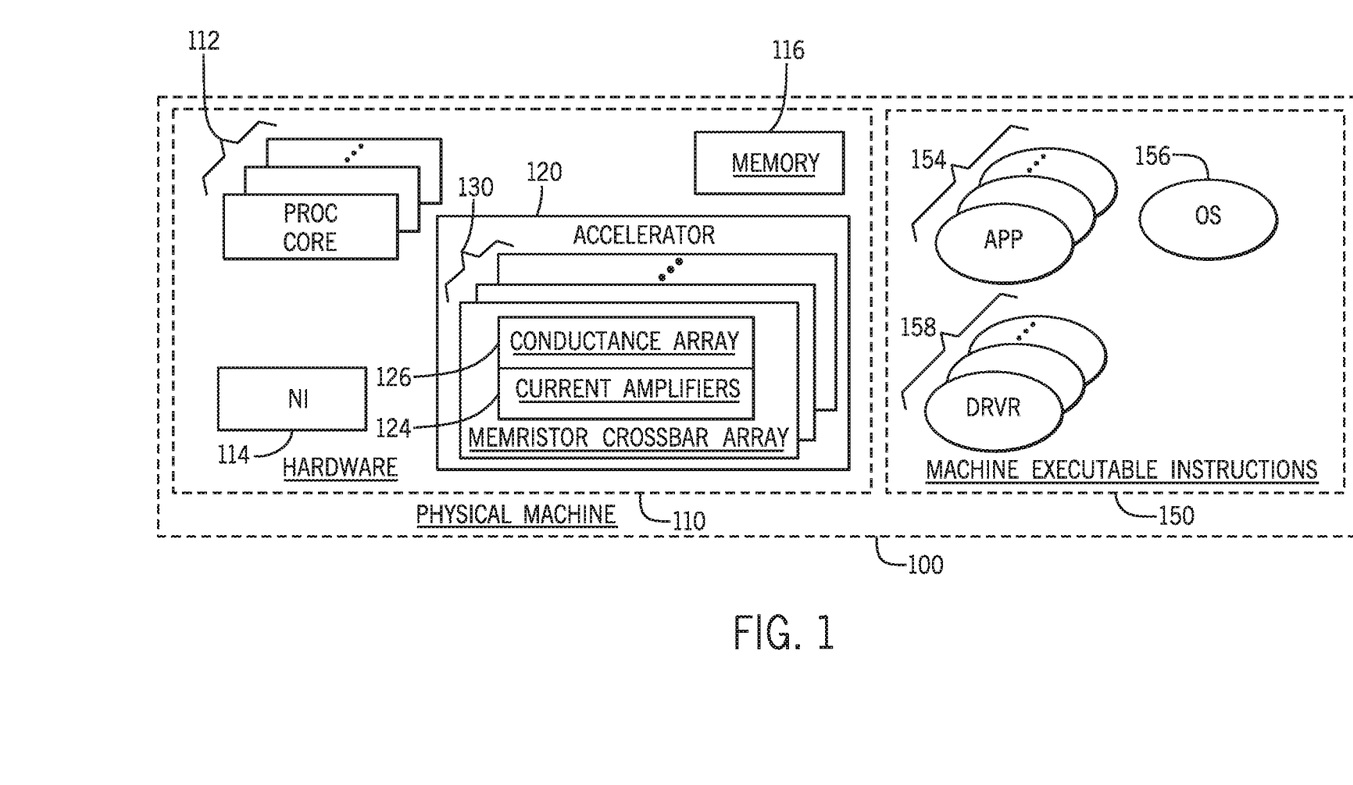
FIG. 1 is a schematic diagram of a physical machine according to an example implementation.

Referring to FIG. 1, in accordance with example implementations, a physical machine 100 includes a memristor-based accelerator 120 for purposes of efficiently performing a Discrete Fourier Transform (DFT) on an input vector to produce a corresponding output vector. The "input vector" refers to a set of ordered values to which the DFT is applied. As examples, the input vector may represent discrete samples of a function or signal. As a more specific example, the input vector may represent time ordered samples of a time varying signal, such as a video signal, an audio signal, and so forth. The "output vector" refers to a set of ordered values, resulting from the application of the DFT to the ordered samples of the input vector. As an example, the output vector may represent frequency and phase components of a signal represented by the input vector. The "values" of the input and output vectors may be continuous or discrete values, depending on the particular implementation.

In the context of this application, "DFT" refers to either a forward DFT or an inverse DFT. For clarity, in the following discussion, unless otherwise noted, a forward DFT is assumed, although, in accordance with example implementations, the memristor-based accelerator 120 may be used to perform a reverse DFT by juxtaposing the input and output vectors.

Depending on the particular implementation, the input vector may be a real value input vector in that the values of the input vector are purely real values and do not contain imaginary components. For example, the input vector may represent discrete samples of a real value signal, such as discrete samples of the amplitude of a time-varying audio signal, discrete samples of the intensity of a spatially-varying image signal, and so forth. In accordance with further example implementations, the input vector may be a complex value input vector in that the input vector may contain complex values, i.e., values that have real and imaginary components. For example, the input vector may represent in-phase and quadrature phase components of an angle modulated signal, where the in-phase and quadrature phase components may be represented by real and imaginary components, respectively.

In accordance with example implementations, the output vector is a complex value signal, i.e., the output vector represents both real and imaginary components.

In accordance with example implementations, the DFT is a matrix operation in which the output vector is the result of the matrix product of the input vector and a DFT matrix. In the following discussion, the elements of the DFT matrix are referred to as "twiddles," and in accordance with example implementations, the twiddle may be a complex value, i.e., the twiddle has real and imaginary components.

As depicted in FIG. 1, in accordance with example implementations that are discussed herein, the memristor-based accelerator 120 includes one or multiple memristor crossbar arrays 130. The memristor crossbar array 130 refers to a rectangular or square array of memristors that are arranged in rows and columns. In general, a memristor is a storage component that has a conductance that is programmed by a current, and the value of the programmed conductance is a function of the programming current's magnitude and direction. The memristor crossbar array 130 includes a set of parallel electrical conductors called "column lines" and an orthogonal set of parallel electrical conductors called "row lines." Each memristor is connected to a row line and a column line.

The memristors of the memristor crossbar array 130 have corresponding conductances, and as such, the conductances form a conductance array 126. In accordance with example implementations that are described herein, the conductances of one or multiple conductance arrays 126 represent the twiddles of a DFT matrix. More specifically, in accordance with example implementations, the conductance array 126 corresponds to the matrix transposition of the DFT matrix. In this manner, the rows of the conductance array 126 correspond to the columns of the DFT matrix, and vice versa.

In this context, the conductance array 126 "corresponding to" the matrix transposition of the DFT matrix refers to the conductance array representing at least some elemental components of the transposed DFT matrix. For example, as described further below, in accordance with some implementations, a given DFT matrix may contain complex values (i.e., the twiddles of the DFT matrix may be complex), and multiple conductance arrays 126 may be used to represent the DFT matrix. In this manner, as further described herein, for a given DFT matrix, one or multiple conductance arrays 126 may represent the real twiddle components of the DFT matrix, and one or multiple conductance arrays 126 may represent the imaginary twiddle components of the DFT matrix.

Moreover, in accordance with example implementations, the input vector values are provided to the rows of the memristor crossbar array 130, and the conductances of each column of the memristor crossbar array 130 provides an associated value for the output vector. In this manner, in accordance with example implementations, the memristor crossbar array 130 includes summing current amplifiers 124, with each column of the array 130 being associated with one of the current amplifiers 124. More particularly, as described further below, a given current amplifier 124 adds the currents contributed by the conductances of the associated column (which corresponds to a row of the DFT matrix) to effectively take the dot product of a DFT matrix row and the input vector.

Among the advantages of using the memristor-based accelerator 120 to perform a DFT, the accelerator 120 may perform the DFT in a single computational step. For example, in accordance with some implementations, an N×N memristor crossbar array 130 may be used to perform $N^2$ complex multiplications and $N^2-N$ additions in a constant time step. Moreover, the memristor-based accelerator 120 may be used to target selected frequency components of interest. In this manner, in accordance with example implementations, each row of the DFT (and thus, each column of a crossbar array 130) may be associated with a single frequency. Therefore, a coarse frequency scan may be performed (skipping over many frequencies), while performing a finer resolution scan across narrower frequency bands of interest. Moreover, as noted above, the memristor-based accelerator 120 may be used to perform an inverse Fourier transform. In this manner, the inverse Fourier transform is symmetric, and as such, the input and output vectors to the accelerator 120 may be reversed. The memristor-based accelerator 120 may be also used to perform non-square transforms (i.e., apply rectangular DFT matrices), and the memristor-based accelerator 120 may be used to apply a DFT for an input vector that has values associated with a non-uniform sampling spacing.

In accordance with example implementations, the memristor-based accelerator 120 may contains various components other than the conductance array 124 and current amplifiers 124, such as circuitry for purposes of programming/reprogramming the memristors of a given memristor crossbar array 130 so that the corresponding conductance array 126 corresponds to the given transposed DFT matrix. The memristor-based accelerator 120 may have buffers to store incoming data, buffers to store outgoing data, circuitry to route input and output data to and from its memristor crossbar arrays 130, and so forth. Moreover, in accordance with some implementations, the memristor-based accelerator 120 may contain analog-to-digital converters (ADCs) and digital-to-analog converters (DACs) for purpose of providing analog signals as inputs to a given memristor crossbar array 130 and receiving corresponding analog signals as outputs from the array 130. Thus, many variations are contemplated, which are within the scope of the appended claims.

In general, the physical machine 100, in accordance with example implementations, is an actual machine that is made up from machine executable instructions 150, or "software," and actual physical hardware 110. In addition to the memristor-based accelerator 120, the hardware 110 may include one or multiple processing cores 112, (central processing unit (CPUs) cores, graphical processing cores (GPU) cores, and so forth); one or multiple network interfaces 114, one or more volatile and/or non-volatile memories 116; and so forth. The machine executable instructions 150 may include, for example, one or multiple applications 154, which use the memristor-based accelerator 120 to perform DFTs. Moreover, as depicted in FIG. 1, in accordance with example implementations, the machine executable instructions 150 may include instructions that when executed form an operating system (OS) 156, one or multiple device drivers 158, and so forth.

Figure 2:
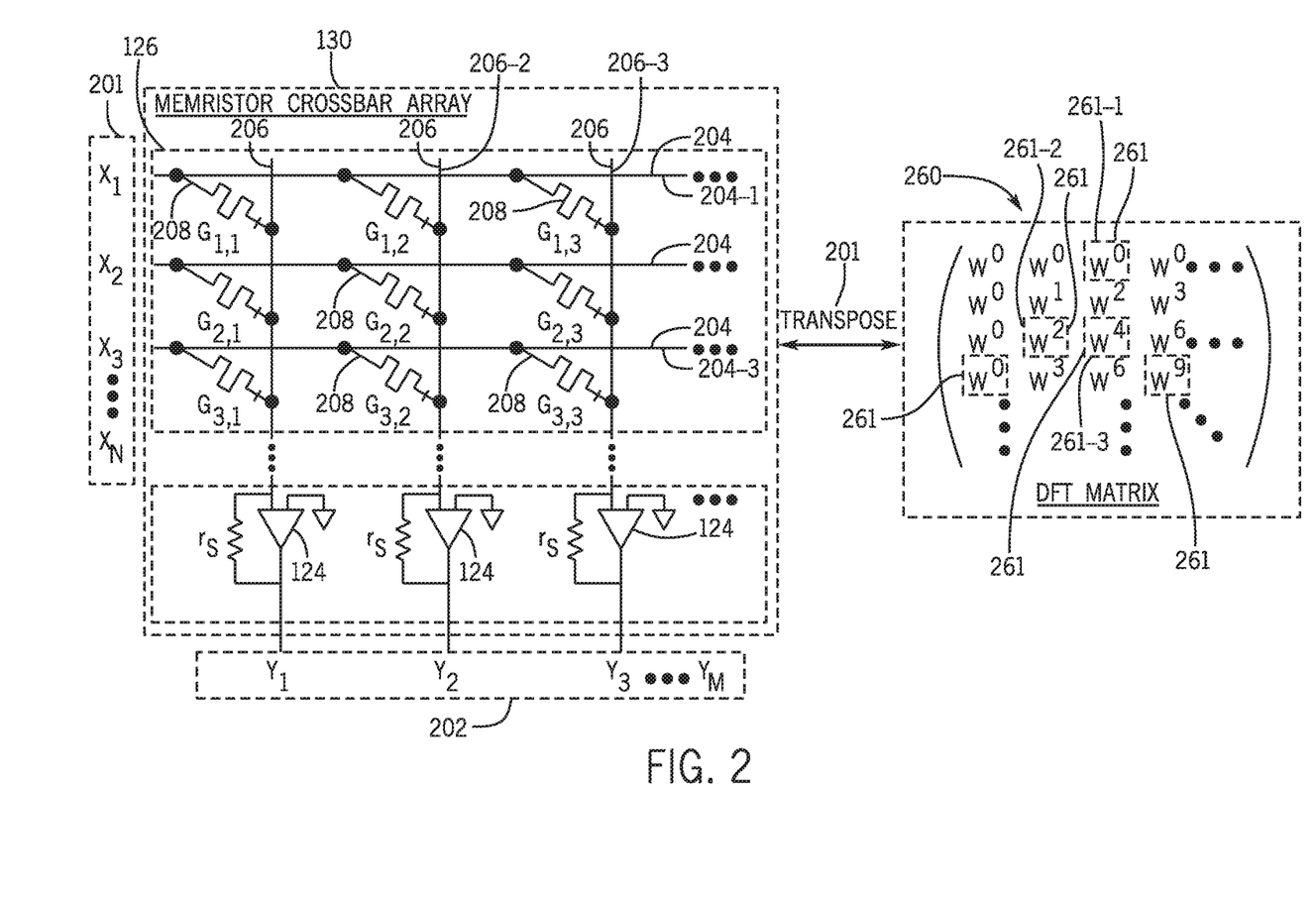
FIG. 2 is an illustration of the representation of a Discrete Fourier Transform (DFT) matrix by conductances of a memristor crossbar array according to an example implementation.

Referring to FIG. 2, in accordance with example implementations, an example memristor crossbar array 130 includes a first set of parallel electrical conductors, which form row lines 204 (example row lines 204-1, 204-2 and 204-3 being depicted in FIG. 2) of the array 130 and which receive corresponding values $X_1, X_2, X_3 \ldots X_N$ of an N value input vector 201. The memristor crossbar array 130 further includes another set of parallel electrical conductors, which are orthogonal to the row lines and form column lines 206 (example column lines 206-1, 206-2 and 206-3 being depicted in FIG. 2) of the array 130. In accordance with example implementations, the row 204 and column 206 lines overlap, and each overlapping point is associated with a memristor 208 that couples the overlapping row 204 and column 206 lines together.

Each memristor 208 has an associated conductance $G_{ij}$, where "i" represents a row index and "j" represents a column index of the memristor 208. Thus, the $G_{1,3}$ conductance refers to the conductance of the memristor 208 coupling the row line 204-1 to the column 206-3; the $G_{3,3}$ conductance refers to the conductance of the memristor 208 coupling the row line 204-3 to the column line 206-3; the $G_{3,2}$ conductance refers to the conductance of the memristor 208 coupling the row line 204-3 to the column line 206-2; and so forth.

Collectively, the $\{G_{ij}\}$ conductances form the conductance array 126, and relationship between the $\{G_{ij}\}$ conductances and a matrix of elemental components of a DFT matrix 260 may be described as follows:

$$\{G_{ij}\}=\{DFT^T\}_{ij}, \qquad \text{Eq. 1.}$$

where "DFT" in Eq. 1 represents, for example, a matrix of the real twiddle components of the DFT matrix 260 or the matrix of imaginary twiddle components of the DFT matrix 260. Thus, the conductance array 126 corresponds to the matrix transposition 201 of the DFT matrix 260 i.e., the rows of the conductance array 126 correspond to the columns of the DFT matrix 260, and vice versa.

In accordance with example implementations, each column line 206 is coupled to the input terminal of an associated summing current amplifier 124, and each current amplifier 124 provides one of the values $(Y_1, Y_2, Y_3 \ldots Y_M)$ of an M value output vector 202. It is noted that depending on the particular implementation, the number of values for the input (N) and output (M) vectors may be different, depending on whether the memristor crossbar array 130 is being used to perform a rectangular or square transformation.

In accordance with example implementations, the current amplifier 124 provides a voltage that represents a summation of the currents that are provided by the memristors 208 of the associated column. In this manner, if the input vector values and output vector values are represented by voltages, then an output value $Y_j$ for a given column of the memristor crossbar array 130 may be related to the values of the input vector 201 as follows:

$$Y_j = \Sigma_i G_{ij} \cdot X_i \qquad \text{Eq. 2}$$

In accordance with example implementations, each current amplifier 124 provides an output that represents the dot product of the input vector 201 and a column of the conductance array 126. In other words, in accordance with example implementations, each current amplifier 124 provides an output representing the dot product of the input vector 201 and a row of the corresponding matrix of DFT elemental components (a matrix Re (DFT), representing the real value components of the DFT matrix 260, for example), such that the output vector 202 represents the matrix product of the input vector 201 and the matrix of DFT elemental components.

The DFT matrix 260 is an array of twiddles 261 (represented by "$w^m$" in the following discussion). As examples, twiddles 261-1 and 261-2 correspond to conductances $G_{3,1}$ and $G_{2,3}$, respectively. In general, in accordance with example implementations, a $w^m$ twiddle is a complex value that may be represented as follows:

$$w^m = e^{\frac{-2\pi i m}{N}} = \cos\frac{2\pi m}{N} - i\sin\frac{2\pi m}{N}, \quad \text{Eq. 3}$$

where "N" represents the dimension "N" of an N×N array, and "m" represents a twiddle frequency index.

In accordance with some implementations, the input vector 201 may contain complex values; and to compute the DFT for such an input vector 201, four N×N memristor crossbar arrays 130 (and four corresponding conductance arrays 126) are used: first and second crossbar arrays (called the "$R_e(DFT)_1$" and "$R_e(DFT)_2$" arrays herein) containing the real components of the DFT; and two crossbar arrays (called the "$I_m(DFT)_1$" and "$I_m(DFT)_2$" arrays herein) containing the imaginary values of the DFT. Using these four memristor crossbar arrays, the imaginary ("$I_m[X(f)]$") and real ("$R_e[X(f)]$") transformed components may be derived as follows:

$$I_m[X(f)] = I_m(DFT)_1 * R_e[X_n] + R_e(DFT)_1 * I_m[X_n], \text{ and} \quad \text{Eq. 4}$$

$$R_e[X(f)] = R_e(DFT)_2 * R_e[X_n] - I_m(DFT)_2 * I_m[X_n], \quad \text{Eq. 5}$$

where "$R_e[X_n]$" and "$I_m[X_n]$" represent the real and imaginary components, respectively of the input vector 201.

For a strictly real input vector $\{X_n\}$, DFT $\{X_k\}$ has the property $X_k = X^*_{n-k}$, where "*" represents the complex conjugate. Thus $X_0$ and $X_{N/2}$ are purely real and additional (N/2−1) complex outputs are determined, giving a total of 2+2*(N/2−1)=N individual Fourier components, or rows, for the DFT matrix 260. As such, a single N×N memristor crossbar array 130 may be used.

Figure 3:
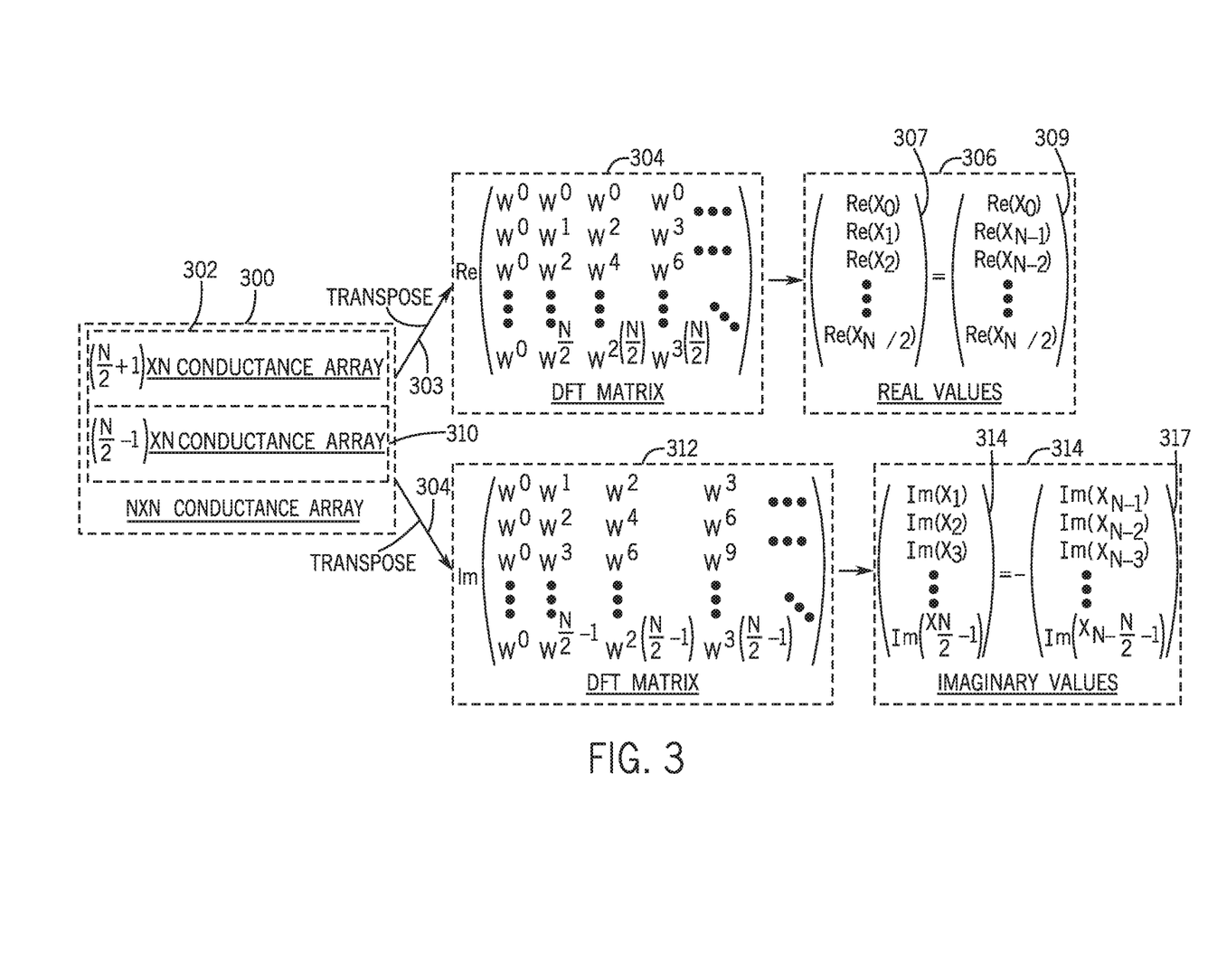
FIG. 3 is an illustration of the use of a memristor crossbar array to apply a DFT to a real value input vector according to an example implementation.

More specifically, referring to FIG. 3, in accordance with example implementations, and N×N memristor crossbar array 300 includes an $$\left(\frac{N}{2} + 1\right) \times N$$

memristor crossbar array 302 and an $$\left(\frac{N}{2} - 1\right) \times N$$

memristor crossbar array 310. The memristor crossbar array 302 stores memristor conductances to represent real components of an $$\left(\frac{N}{2} + 1\right) \times N$$

transposed DFT matrix 304; and the memristor crossbar array 310 stores memristor conductances to represent imaginary values for the $$\left(\frac{N}{2} - 1\right) \times N$$

transposed DFT matrix 312.

As represented at 306 in FIG. 3, the result of the multiplication of the DFT matrix 304 by the input vector results in real components 307, which may be used due to the above-described complex conjugate property produced the remaining real components 309. In a similar manner, the DFT matrix 312 produces imaginary components for the output, as illustrated at 314 in FIG. 3. In this regard, the application of the DFT matrix 312 to the input vector produces imaginary components 315, and due to the above-described conjugate property, the remaining imaginary output values 317 may be derived.

Figure 4:
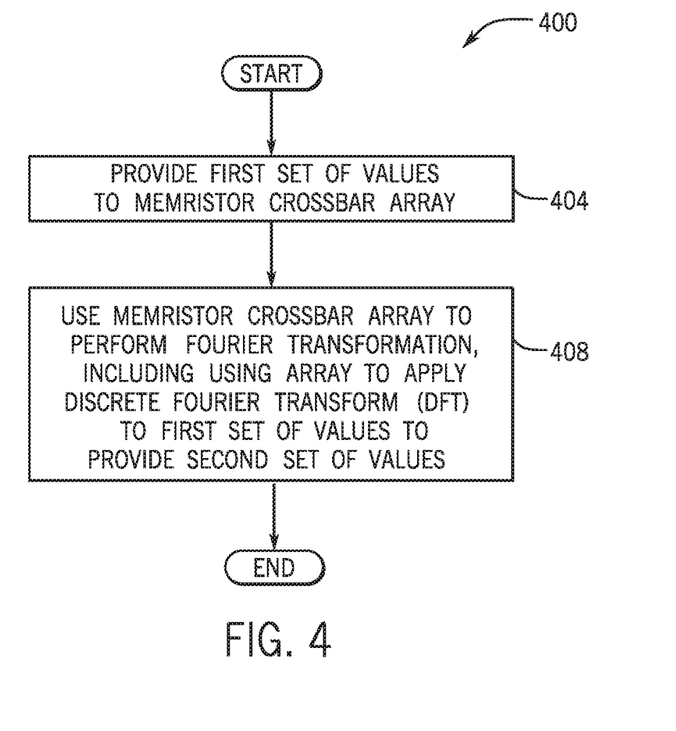
FIG. 4 is a flow diagram depicting a technique to use a memristor crossbar array to perform a Fourier transformation according to an example implementation.

Thus, referring to FIG. 4, in accordance with example implementations, a technique 400 includes providing (block 404) a first set of values to a memristor crossbar array and using (block 408) the memristor crossbar array to perform a Fourier transformation, including using the array to apply a Discrete Fourier Transform (DFT) to the first set of values to provide a second set of values.

Figure 5:
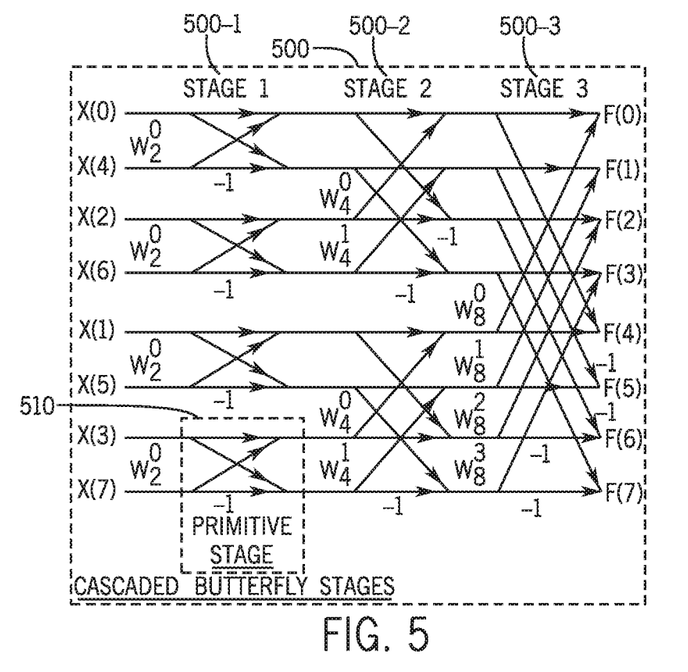
FIG. 5 is an illustration of the use of cascaded stages to perform a DFT according to an example implementation.
Figure 6:
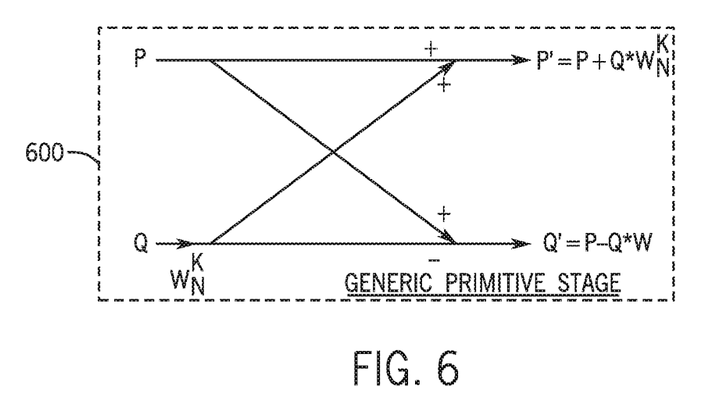
FIG. 6 is an illustration of a primitive stage of FIG. 5 according to an example implementation.

In accordance with example implementations, a Fourier transform greater than an N point transform may be desired, but the memristor crossbar array size may be limited to an N×N size. For these implementations, the Fourier transform may be performed using multiple N×N memristor crossbar arrays. For example, in accordance with some implementations, a "butterfly" trick may be used to perform the Fourier transform. In this regard, referring to FIG. 5, in accordance with some implementations, a Fourier transform may be performed using cascaded butterfly stages 500 (three example stages 500-1, 500-2 and 500-3, being depicted in FIG. 5). For this example, an eight point DFT uses three cascaded butterfly stages 500, where each stage includes four primitive stages 510 and each stage 510 performs 2×2 matrix multiplications and additions. More specifically, FIG. 6 depicts a generic primitive stage 600 in accordance with example implementations. The primitive stage 600 includes two inputs P and Q and produces two outputs P' and Q', which are provided to a primitive stage 600 of the next cascaded butterfly stage.

Figure 7:
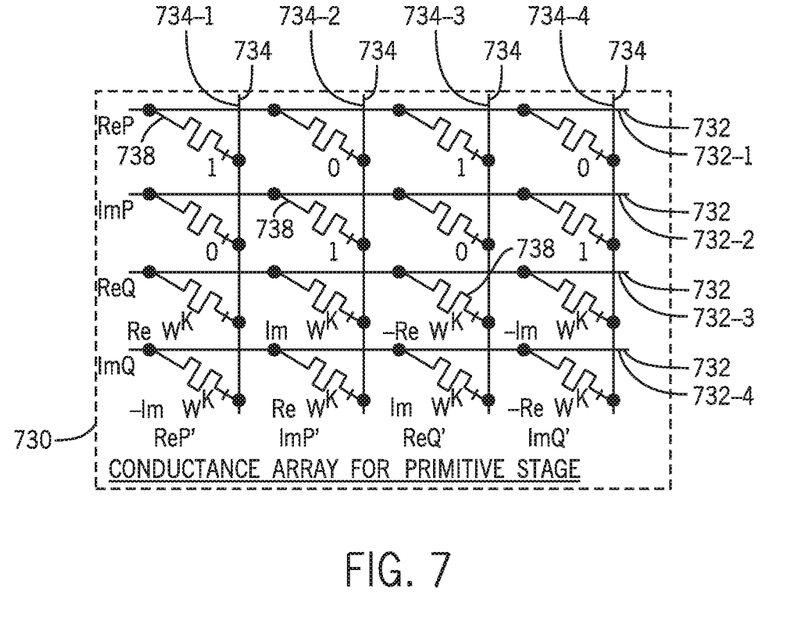
FIG. 7 is an illustration of a memristor crossbar array corresponding to the primitive stage of FIG. 6 according to an example implementation.

Referring to FIG. 7 in conjunction with FIG. 6, in accordance with example implementations, a memristor crossbar array 700 may be used for purposes of applying the multiplications and additions of the primitive stage 600. As shown, for this implementation, the rows of the memristor crossbar array 700 receive the real and imaginary components of the P and Q inputs; and the columns of the memristor crossbar array 700 provide (after current summing by current amplifiers, not shown) the real and imaginary components of the P' and Q' outputs. Therefore, a larger DFT may be formed from a log(N) number of the memristor crossbar arrays 700 to generate an N point DFT for an arbitrarily large N.

While the present invention has been described with respect to a limited number of embodiments, those skilled in the art, having the benefit of this disclosure, will appreciate numerous modifications and variations therefrom. It is intended that the appended claims cover all such modifications and variations as fall within the true spirit and scope of this present invention.

What is claimed is:

1. A method comprising:
providing a first set of values to a memristor crossbar array; and
using the memristor crossbar array perform a Fourier transformation, wherein using the array comprises using the array to apply a Discrete Fourier Transform (DFT) to the first set of values to provide a second set of values.

2. The method of claim 1, further comprising:
providing a memristor crossbar array having an array of conductances corresponding to a matrix transposition of a DFT matrix associated with the OFT.

3. The method of claim 1, wherein:
the memristor crossbar array comprises an array of conductances associated with rows and columns;
a given column of the array conductances is associated with a row of a OFT matrix; and
using the memristor array comprises summing currents associated with the conductances of the given column to provide a given second value of the second values.

4. The method of claim 1, wherein:
the first set of values comprise real values;
the second set of values comprise complex values; and
using the memristor crossbar array further comprises:
using a first part of the memristor crossbar array to apply a first OFT matrix to the first set of values to provide real components of the complex values; and
using a second part of the memristor crossbar array to apply a second DFT matrix to the second set of values to provide imaginary components of the complex values.

5. The method of claim 1, wherein using the memristor crossbar comprises using N rows of the memristor crossbar by N columns of the memristor crossbar to determine an N point DFT.

6. An apparatus comprising:
a memristor crossbar array-based accelerator to receive a first set of values and apply a Discrete Fourier Transform (DFT) to the first set of values to provide a second set of values,
wherein the DFT comprises cascaded stages and the memristor crossbar array comprises a plurality of memristor crossbar arrays associated with the cascaded stages.

7. The apparatus of claim 6, wherein:
a given cascaded stage of the cascaded stages receives a complex value input and applies a butterfly stage DFT to provide a complex value output.

8. The apparatus of claim 7, wherein the memristor crossbar array associated with the given cascaded stage comprises:
a first plurality of conductors associated with the complex value input;
a second plurality of conductors associated with the complex value output; and
memristors, each memristor to couple one of the conductors of the first plurality of conductors to one of the conductors of the second plurality of conductors.

9. The apparatus of claim 6, wherein the DFT comprises an N point transform, and the memristor crossbar array comprises a log(N) number of the memristor crossbar arrays.

10. The apparatus of claim 6, wherein the first set of values comprise continuous values signals.

11. The apparatus of claim 6, wherein the first set of values comprise discrete samples of a continuous signal.

12. An apparatus comprising:
an array comprising:
a first plurality of conductors;
a second plurality of conductors having associated intersections with the first plurality of conductors; and
memristors associated with the intersections, wherein the memristors have conductances to form an array of conductances corresponding to a matrix transposition of a Discrete Fourier Transform (OFT) matrix.

13. The apparatus of claim 12, wherein:
the first plurality of conductors comprise real values;
the second plurality of conductors complex values; and
the memristor crossbar array comprises:
a first subarray to apply a first DFT matrix to the signals associated with the real value input to provide real components of the complex values; and
a second subarray to apply a second DFT matrix to the signals associated with real value input to provide imaginary components of the complex values.

14. The apparatus of claim 13, wherein the memristor crossbar array comprises using N rows by N columns of memristors, and the DFT matrix comprises an N point DFT matrix.

15. The apparatus of claim 14, further comprising:
a processor to provide a signal to the array and receive a signal from the array representing application of the DFT matrix to the provided signal.

* * * * *